United States Patent
Asano et al.

(10) Patent No.: US 11,433,500 B2
(45) Date of Patent: Sep. 6, 2022

(54) MANUFACTURING METHOD FOR PHOSPHOR GLASS THIN PLATE AND PIECE THEREOF, AND PHOSPHOR GLASS THIN PLATE AND PIECE THEREOF

(71) Applicant: NIPPON ELECTRIC GLASS CO., LTD., Otsu (JP)

(72) Inventors: Hideki Asano, Otsu (JP); Tomomichi Kunimoto, Otsu (JP); Hiroyuki Shimizu, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 160 days.

(21) Appl. No.: 16/772,190

(22) PCT Filed: Jan. 28, 2019

(86) PCT No.: PCT/JP2019/002631
§ 371 (c)(1),
(2) Date: Jun. 12, 2020

(87) PCT Pub. No.: WO2019/151168
PCT Pub. Date: Aug. 8, 2019

(65) Prior Publication Data
US 2021/0069851 A1    Mar. 11, 2021

(30) Foreign Application Priority Data

Feb. 5, 2018 (JP) ............................. JP2018-017997
May 29, 2018 (JP) ............................. JP2018-102191

(51) Int. Cl.
B24B 7/24   (2006.01)
B24B 37/10  (2012.01)
(Continued)

(52) U.S. Cl.
CPC ............ *B24B 7/242* (2013.01); *B24B 37/105* (2013.01); *B24B 37/22* (2013.01); *B24B 37/245* (2013.01);
(Continued)

(58) Field of Classification Search
CPC ........... H01L 2933/0041; H01L 33/505; B24B 37/105
See application file for complete search history.

(56) References Cited

U.S. PATENT DOCUMENTS

2005/0046334 A1* 3/2005 Fujiwara ................. C30B 23/00
                                                          313/498
2005/0130386 A1* 6/2005 Watanabe ............... B24B 37/30
                                                          451/64
(Continued)

FOREIGN PATENT DOCUMENTS

JP          61-203269 A      9/1986
JP        2007-290078 A     11/2007
(Continued)

OTHER PUBLICATIONS

Official Communication issued in International Patent Application No. PCT/JP2019/002631, dated Apr. 16, 2019.
(Continued)

*Primary Examiner* — Andrew J Coughlin
(74) *Attorney, Agent, or Firm* — Keating and Bennett, LLP

(57) ABSTRACT

Provided is a manufacturing method for a thin phosphor glass plate by which a thin phosphor glass plate can be more certainly produced. A manufacturing method includes the steps of: preparing a phosphor glass base material 21 having a first principal surface 21a and a second principal surface 21b opposed to each other; placing the phosphor glass base material 21 on a stage 22 and fixing the second principal (Continued)

surface 21b onto the stage 22; and polishing the first principal surface 21a of the phosphor glass base material 21 with a polishing member 23 including an abrasive layer 24.

12 Claims, 6 Drawing Sheets

(51) Int. Cl.
    *B24B 37/22*     (2012.01)
    *B24B 37/24*     (2012.01)
    *C03C 4/12*     (2006.01)
    *H01L 33/50*     (2010.01)

(52) U.S. Cl.
    CPC .............. *C03C 4/12* (2013.01); *H01L 33/502* (2013.01); *C03C 2204/08* (2013.01)

(56) References Cited

U.S. PATENT DOCUMENTS

| | | |
|---|---|---|
| 2005/0245051 A1 | 11/2005 | Maekawa et al. |
| 2011/0149549 A1* | 6/2011 | Miyake ............... G03B 21/204 362/84 |
| 2012/0230007 A1* | 9/2012 | Kawakami ............. F21V 13/14 362/19 |
| 2015/0198303 A1* | 7/2015 | Park ..................... C09K 11/08 428/210 |
| 2016/0093777 A1 | 3/2016 | Sato et al. |
| 2017/0125649 A1 | 5/2017 | Sato et al. |
| 2018/0145231 A1 | 5/2018 | Fujii et al. |
| 2018/0198038 A1 | 7/2018 | Sato et al. |
| 2019/0119148 A1 | 4/2019 | Fujita et al. |

FOREIGN PATENT DOCUMENTS

| | | |
|---|---|---|
| JP | 4198601 B2 | 12/2008 |
| JP | 2010-082700 A | 4/2010 |
| JP | 2011-122067 A | 6/2011 |
| JP | 2015-137283 A | 7/2015 |
| JP | 2016-072441 A | 5/2016 |
| JP | 2016-072515 A | 5/2016 |
| JP | 2016-147491 A | 8/2016 |
| JP | 2016-222902 A | 12/2016 |
| JP | 2018-002762 A | 1/2018 |
| WO | 2018/012273 A1 | 1/2018 |

OTHER PUBLICATIONS

Official Communication issued in corresponding Japanese Patent Application No. 2018-102191, dated May 24, 2022.

* cited by examiner

[FIG. 1.]
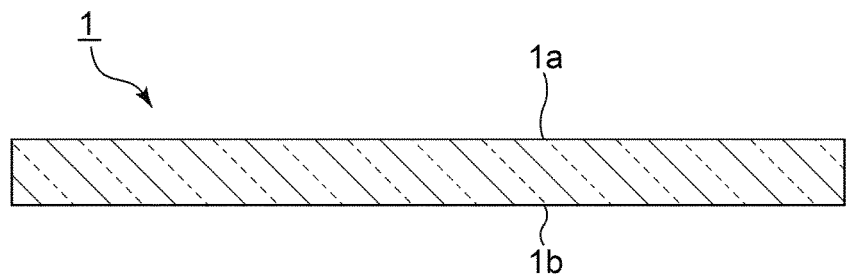
[FIG. 2.]
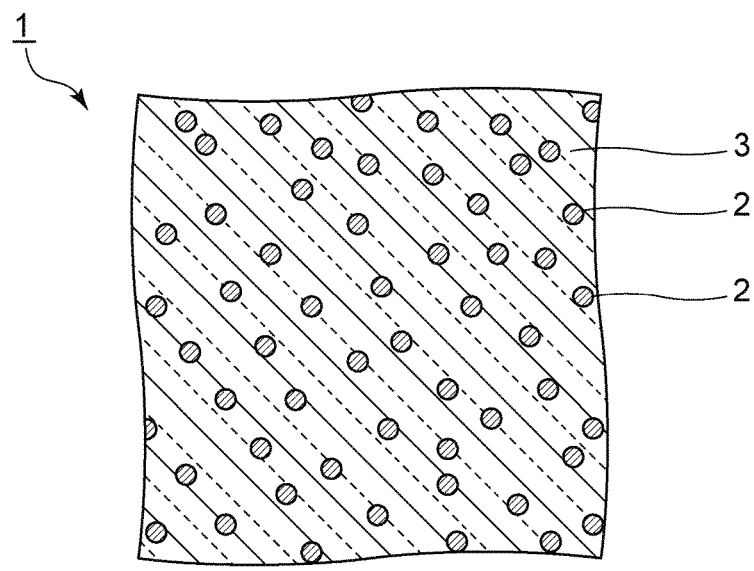
[FIG. 3.]
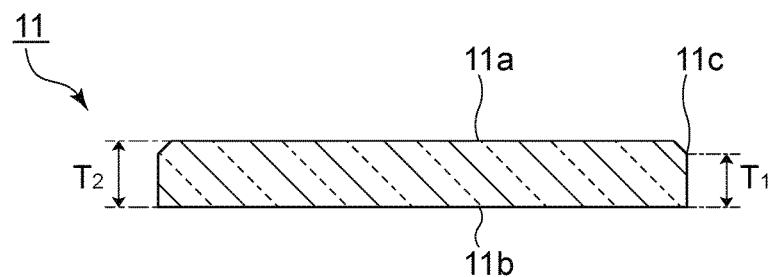

[FIG. 4.]
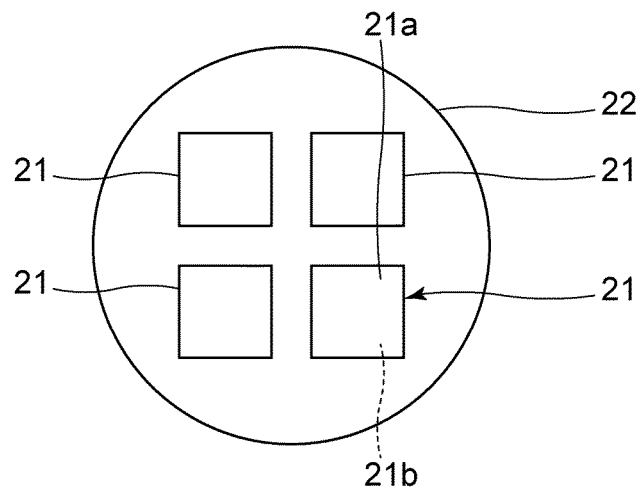
[FIG. 5.]
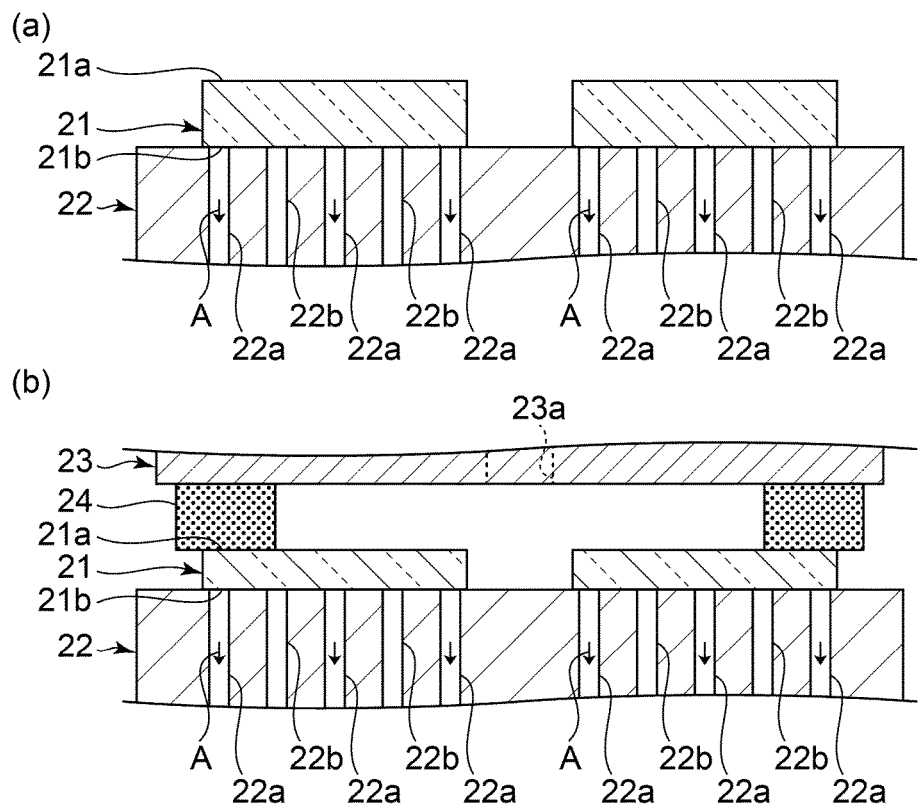

[FIG. 6.]
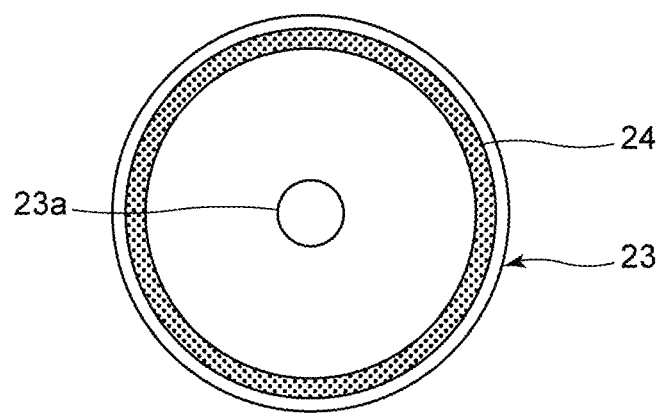
[FIG. 7.]
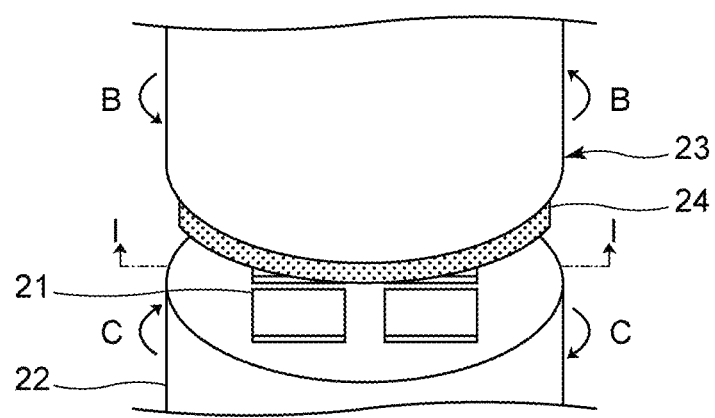

[FIG. 8.]
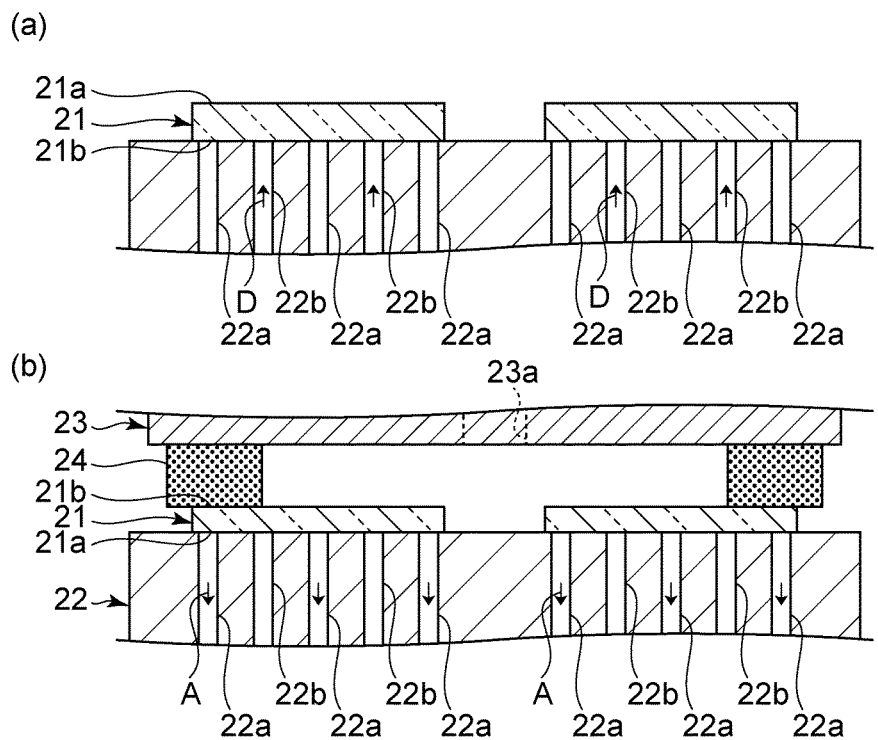
[FIG. 9.]
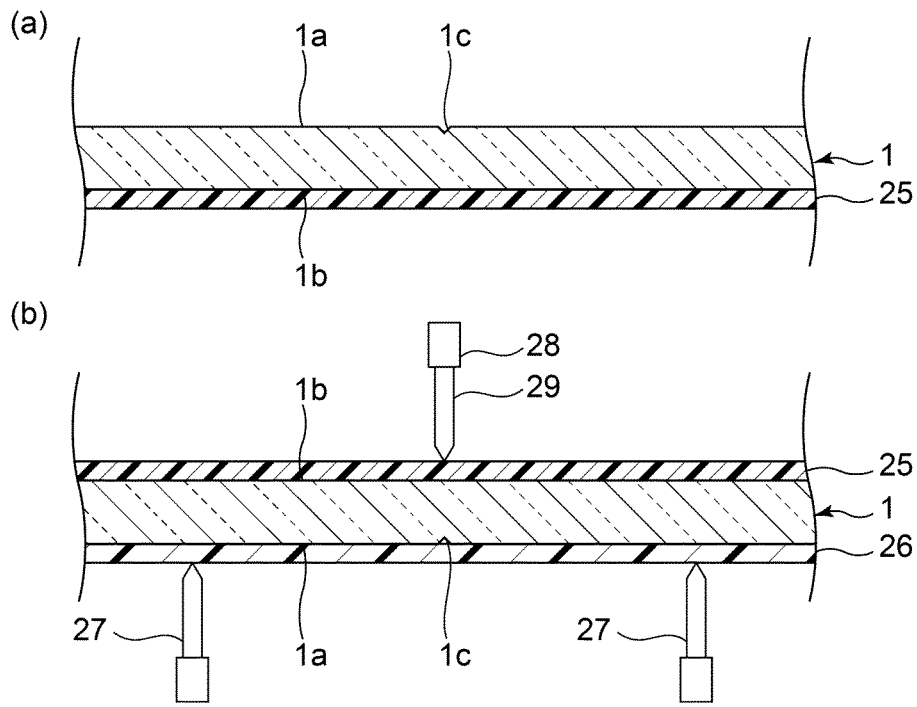

[FIG. 10.]
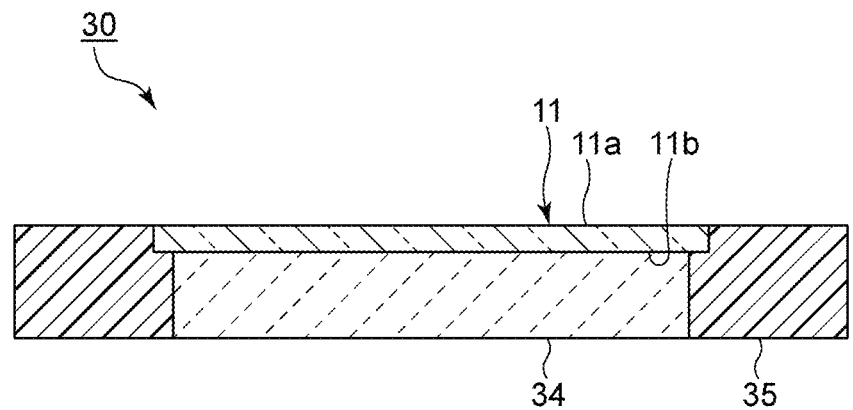
[FIG. 11.]
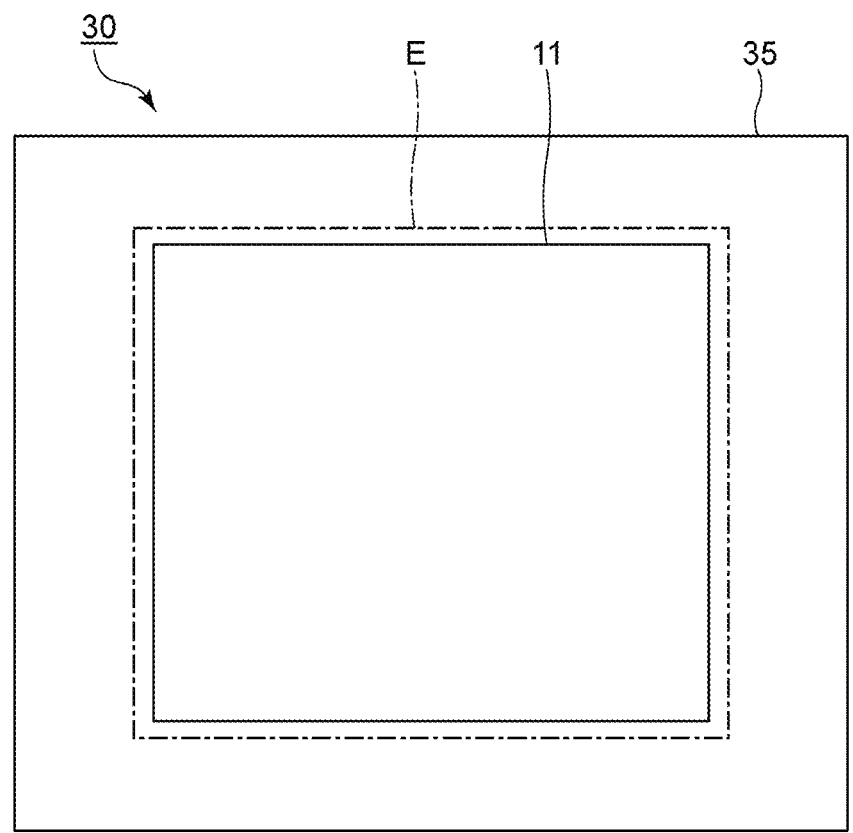

[FIG. 12.]
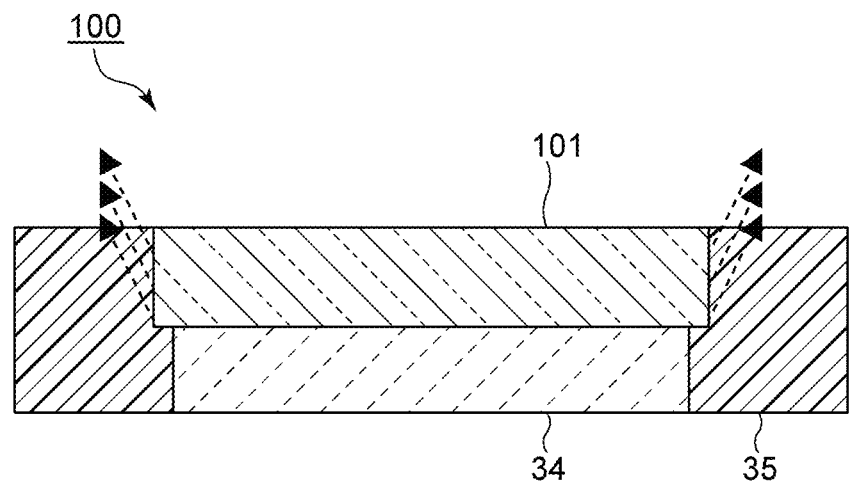
[FIG. 13.]
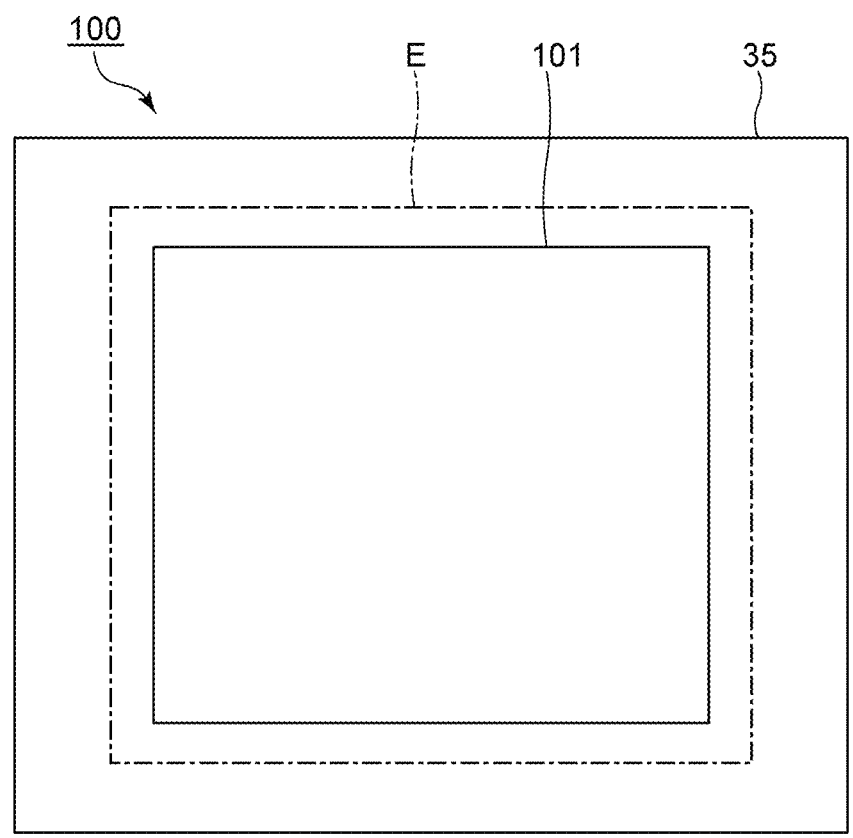

MANUFACTURING METHOD FOR PHOSPHOR GLASS THIN PLATE AND PIECE THEREOF, AND PHOSPHOR GLASS THIN PLATE AND PIECE THEREOF

TECHNICAL FIELD

The present invention relates to manufacturing methods for thin phosphor glass plates and pieces thereof and thin phosphor glass plates and pieces thereof.

BACKGROUND ART

Recently, attention has been increasingly focused on light-emitting devices and the like using LEDs or LDs, as next-generation light sources to replace fluorescence lamps and incandescent lamps. As an example of such a next-generation light source, there is a disclosure of a light-emitting device in which an LED capable of emitting a blue light is combined with a wavelength conversion member capable of absorbing part of the light from the LED to convert it to a yellow light. This light-emitting device emits a white light which is a synthesized light of the blue light emitted from the LED and the yellow light emitted from the wavelength conversion member. Patent Literature 1 proposes a wavelength conversion member as a phosphor glass plate in which a phosphor powder is dispersed in a glass matrix.

CITATION LIST

Patent Literature

[PTL 1]
JP-A-2011-122067

SUMMARY OF INVENTION

Technical Problem

As a phosphor glass plate has a smaller thickness, its luminous flux can be greater and it can be more easily reduced in size. However, the phosphor glass plate has a problem that as its thickness is smaller, the phosphor glass plate is more likely to be broken during production and the yield becomes poorer.

An object of the present invention is to provide a manufacturing method for a thin phosphor glass plate by which a thin phosphor glass plate can be more certainly manufactured.

Another object of the present invention is to more certainly provide a thin phosphor glass plate.

Solution to Problem

A manufacturing method for a thin phosphor glass plate according to the present invention includes the steps of: preparing a phosphor glass base material having a first principal surface and a second principal surface opposed to each other; placing the phosphor glass base material on a stage and fixing the second principal surface onto the stage; and polishing the first principal surface of the phosphor glass base material with a polishing member including an abrasive layer.

The manufacturing method preferably further includes the steps of: fixing the first principal surface of the phosphor glass base material onto the stage; and polishing the second principal surface of the phosphor glass base material with the polishing member.

In the step of polishing the phosphor glass base material, the polishing member is preferably rotated around an axis of rotation extending in a thickness direction of the phosphor glass base material.

In the step of polishing the phosphor glass base material, the stage is preferably rotated around an axis of rotation extending in a thickness direction of the phosphor glass base material.

In the step of polishing the phosphor glass base material, the polishing member and the stage are preferably rotated in mutually opposite directions around an axis of rotation extending in the thickness direction of the phosphor glass base material.

In the step of polishing the phosphor glass base material, the phosphor glass base material is preferably polished to have a thickness of 0.15 mm or less.

In the step of polishing the phosphor glass base material, the phosphor glass base material is preferably polished so that a polished one of the first principal surface and the second principal surface has an arithmetic mean roughness (Ra) of below 0.1 μm.

The phosphor glass base material is preferably fixed onto the stage by suction.

After the step of polishing the phosphor glass base material, the phosphor glass base material is preferably stripped off from the stage by jetting a liquid from the stage to the phosphor glass base material.

A manufacturing method for pieces of a thin phosphor glass plate according to the present invention includes the steps of: forming breaking grooves in the principal surface of the thin phosphor glass plate manufactured by the above-described manufacturing method; and breaking the thin phosphor glass plate into pieces along the breaking grooves.

A thin phosphor glass plate according to the present invention includes a first principal surface and a second principal surface opposed to each other and has an arithmetic mean roughness (Ra) of below 0.1 μm at the first principal surface and a thickness of 0.15 mm or less.

A piece of thin phosphor glass plate according to the present invention is apiece of thin phosphor glass plate divided from the above-described thin phosphor glass plate, wherein a portion of the piece located at an outer peripheral edge in plan view has a smaller thickness than a portion of the piece located at a center in plan view.

Advantageous Effects of Invention

The present invention enables provision of a manufacturing method for a thin phosphor glass plate by which a thin phosphor glass plate and its pieces can be more certainly manufactured. Furthermore, the present invention enables more certain provision of a thin phosphor glass plate and its pieces.

BRIEF DESCRIPTION OF DRAWINGS

FIG. 1 is a schematic cross-sectional view showing a thin phosphor glass plate according to an embodiment of the present invention.

FIG. 2 is a schematic enlarged cross-sectional view showing the thin phosphor glass plate according to the embodiment of the present invention.

FIG. 3 is a schematic cross-sectional view showing a piece of thin phosphor glass plate according to an embodiment of the present invention.

FIG. 4 is a schematic plan view for illustrating a manufacturing method for a thin phosphor glass plate according to an embodiment of the present invention.

FIGS. 5(a) and 5(b) are schematic cross-sectional views for illustrating the manufacturing method for a thin phosphor glass plate according to the embodiment of the present invention.

FIG. 6 is a view of a polishing member for use in the manufacturing method for a thin phosphor glass plate according to the embodiment of the present invention when viewed from the side where a phosphor glass base material is polished.

FIG. 7 is a schematic perspective view for illustrating the manufacturing method for a thin phosphor glass plate according to the embodiment of the present invention.

FIGS. 8(a) and 8(b) are schematic cross-sectional views for illustrating the manufacturing method for a thin phosphor glass plate according to the embodiment of the present invention.

FIGS. 9(a) and 9(b) are schematic cross-sectional views for illustrating a manufacturing method for a thin phosphor glass plate according to an embodiment of the present invention.

FIG. 10 is a schematic cross-sectional view showing an example of a light-emitting device in which the piece of thin phosphor glass plate according to the embodiment of the present invention is used.

FIG. 11 is a schematic plan view showing the example of a light-emitting device in which the piece of thin phosphor glass plate according to the embodiment of the present invention is used.

FIG. 12 is a schematic cross-sectional view of a light-emitting device according to a comparative example.

FIG. 13 is a schematic plan view of the light-emitting device according to the comparative example.

DESCRIPTION OF EMBODIMENTS

Hereinafter, a description will be given of preferred embodiments. However, the following embodiments are merely illustrative and the present invention is not limited to the following embodiments. Throughout the drawings, members having substantially the same functions may be referred to by the same reference characters.

(Thin Phosphor Glass Plate and Piece Thereof)

FIG. 1 is a schematic cross-sectional view showing a thin phosphor glass plate according to an embodiment of the present invention. FIG. 2 is a schematic enlarged cross-sectional view showing the thin phosphor glass plate according to the embodiment of the present invention. A thin phosphor glass plate 1 shown in FIG. 1 is used, for example, in a wavelength conversion member. As shown in FIG. 2, in this embodiment, the thin phosphor glass plate 1 includes a phosphor 2 and a glass matrix 3 in which the phosphor 2 is dispersed.

For example, excitation light is emitted from a light source, such as an LED, and enters the thin phosphor glass plate 1. Part of the excitation light is converted in wavelength to fluorescence by the phosphor 2 and the fluorescence is emitted from the phosphor 2. A synthesized light of the fluorescence and the excitation light is emitted from the thin phosphor glass plate 1.

The type of the phosphor 2 is not particularly limited so long as it can emit fluorescence upon incidence of excitation light. Specific examples of the phosphor 2 include one or more selected from the group consisting of an oxide phosphor, a nitride phosphor, an oxynitride phosphor, a chloride phosphor, an oxychloride phosphor, a sulfide phosphor, an oxysulfide phosphor, a halide phosphor, a chalcogenide phosphor, an aluminate phosphor, a halophosphoric acid chloride phosphor, and a garnet-based compound phosphor. In using a blue light as the excitation light, for example, a phosphor capable of emitting a green light, a yellow light or a red light as fluorescence can be used.

The type of the glass matrix 3 is not particularly limited so long as it can be used as a dispersion medium for the phosphor 2. For example, a borosilicate-based glass, a phosphate-based glass, a tin-phosphate-based glass or a bismuthate-based glass can be used. Examples of the borosilicate-based glass include those containing, in terms of % by mass, 30% to 85% $SiO_2$, 0% to 30% $Al_2O_3$, 0% to 50% $B_2O_3$, 0% to 10% $Li_2O+Na_2O+K_2O$, and 0% to 50% $MgO+CaO+SrO+BaO$. Examples of the tin-phosphate-based glass include those containing, in terms of % by mole, 30% to 90% $SnO$ and 1% to 70% $P_2O_5$.

As shown in FIG. 1, the thin phosphor glass plate 1 has a first principal surface 1a and a second principal surface 1b opposed to each other. The first principal surface 1a and the second principal surface 1b have an arithmetic mean roughness (Ra) of below 0.1 μm. Thus, during incidence of excitation light on the thin phosphor glass plate 1, light scattering is less likely to occur. Likewise, during exit of a synthesized light of excitation light and fluorescence from the thin phosphor glass plate 1, light scattering is less likely to occur. Therefore, the luminous efficiency can be increased. It is sufficient that at least the first principal surface 1a has an arithmetic mean roughness (Ra) of below 0.1 μm. The arithmetic mean roughness (Ra) used herein refers to an arithmetic mean roughness (Ra) defined in JIS B 0601: 2013.

The first principal surface 1a and the second principal surface 1b preferably have an arithmetic mean roughness (Ra) of 0.05 μm or less. Thus, the luminous efficiency can be further increased.

The thickness of the thin phosphor glass plate 1 is preferably 0.03 mm to below 0.3 mm, more preferably 0.05 mm to 0.15 mm, and particularly preferably 0.08 mm to 0.12 mm. Thus, the luminous flux can be effectively increased. In addition, the effect of increasing the brightness contrast, which will be described later, can be obtained.

The shape of the thin phosphor glass plate 1 according to this embodiment when viewed in plan is rectangular. The shape of the thin phosphor glass plate 1 when viewed in plan is not limited to the above shape and may be, for example, an approximately circular shape or a polygonal shape other than the rectangular shape.

FIG. 3 is a schematic cross-sectional view showing a piece of thin phosphor glass plate according to an embodiment of the present invention. As shown in FIG. 3, a piece 11 of thin phosphor glass plate has a first principal surface 11a and a second principal surface 11b opposed to each other. The piece 11 of thin phosphor glass plate is formed by dividing the thin phosphor glass plate 1 into pieces. More specifically, the thin phosphor glass plate 1 is broken into pieces along breaking grooves formed by, for example, scribing the first principal surface 1a. Therefore, where $T_1$ represents the thickness of a portion of the piece 11 of thin phosphor glass plate located at an outer peripheral edge 11c in plan view and $T_2$ represents the thickness of a portion of the piece 11 of thin phosphor glass plate located at the center in plan view, the thickness $T_1$ is smaller than the thickness $T_2$.

When the piece 11 of thin phosphor glass plate is used in a light-emitting device, the brightness contrast between a light-emitting portion and a non-light-emitting portion of the device can be effectively increased. Details regarding this will be described below with an example of the above light-emitting device.

FIG. 10 is a schematic cross-sectional view showing an example of a light-emitting device in which the piece of thin phosphor glass plate according to the embodiment of the present invention is used. FIG. 11 is a schematic plan view showing the example of a light-emitting device in which the piece of thin phosphor glass plate according to the embodiment of the present invention is used.

As shown in FIG. 10, a light-emitting device 30 includes the piece 11 of thin phosphor glass plate, a light source 34 from which excitation light is incident on the piece 11 of thin phosphor glass plate, and a reflective member 35 provided to surround the piece 11 of thin phosphor glass plate and the light source 34. The light-emitting portion of the light-emitting device 30 is, as shown in FIG. 11, a portion thereof where the piece 11 of thin phosphor glass plate is disposed when viewed in plan. The non-light-emitting portion is a portion where the reflective member 35 is disposed when viewed in plan.

For example, an LED chip can be used as the light source 34. As a material for the reflective member 35, for example, a resin containing a high-reflectance filler is used.

FIG. 12 is a schematic cross-sectional view of a light-emitting device according to a comparative example. FIG. 13 is a schematic plan view of the light-emitting device according to the comparative example.

In a light-emitting device 100 shown in FIG. 12, a thick piece 101 of phosphor glass plate is used. A reflective member 35 cannot reflect all of excitation light and fluorescence. Part of the excitation light and fluorescence may pass through a contact portion where the piece 101 of phosphor glass plate is in contact with the reflective member 35, and leak from a non-light-emitting portion located around a light-emitting portion as shown in the dashed arrows. The leakage is likely to occur particularly in a high-energy region. In the comparative example, the piece 101 of phosphor glass plate is thick and, therefore, the contact portion is also thick, so that the light leakage from the non-light-emitting portion cannot sufficiently be reduced. Hence, the contrast at and near the boundary between the light-emitting portion and the non-light-emitting portion is low. As shown in FIG. 13, the above leakage may cause an expansion of a relatively high-brightness area E in a non-light emitting region.

In contrast, in the light-emitting device 30 shown in FIG. 10, the piece 11 of thin phosphor glass plate is thin and, therefore, its contact portion with the reflective member 35 can be effectively reduced in thickness. Thus, the leakage of excitation light and fluorescence from the non-light-emitting portion can be effectively reduced, so that the contrast at and near the boundary between the light-emitting portion and the non-light-emitting portion can be effectively increased. As shown in FIG. 11, it can be restrained that the leakage causes an expansion of a relatively high-brightness area E in a non-light-emitting region. Therefore, in the design of an optical system in which optical components, including lenses and mirrors, are combined, the light-emitting device 30 is less likely to produce stray light and the optical system can easily obtain light distribution properties according to an optical design.

The light-emitting device 30 equipped with the piece 11 of thin phosphor glass plate can be suitably used in, for example, an ADB (adaptive driving beam) headlight requiring a high directionality and a high contrast at and near the boundary between a lighting portion and a non-lighting portion.

An antireflection film may be provided on the first principal surface 11a (light exit surface) of the piece 11 of thin phosphor glass plate. By doing so, during exit of fluorescence or excitation light from the first principal surface 11a, the decrease in light extraction efficiency due to a difference in refractive index between the piece 11 of thin phosphor glass plate and the air can be reduced. The antireflection film is, for example, a single-layer or multi-layer dielectric film made of $SiO_2$, $Al_2O_3$, $TiO_2$, $Nb_2O_5$ or $Ta_2O_5$. The antireflection film may be provided on the second principal surface 11b (light entrance surface) of the piece 11 of thin phosphor glass plate. By doing so, during incidence of excitation light on the piece 11 of thin phosphor glass plate, the decrease in efficiency of excitation light entering the piece 11 of thin phosphor glass plate due to a difference in refractive index between the piece 11 of thin phosphor glass plate and an unshown adhesive layer (an adhesive layer provided between the piece 11 of thin phosphor glass plate and the light source 34) can be reduced.

The antireflection film is generally designed in consideration of the refractive index of the glass matrix 3 in the piece 11 of thin phosphor glass plate. If in this case the phosphor is exposed on the first principal surface 11a of the piece 11 of thin phosphor glass plate, the antireflection film formed on the portions of the exposed phosphor does not have a suitable film design because the phosphor has a relatively high refractive index, so that a sufficient antireflection function may not be achieved. To avoid this, it is preferred that a glass layer (a phosphor-free glass layer) be provided on the first principal surface 11a of the piece 11 of thin phosphor glass plate to form a coating over the exposed phosphor. By doing so, the refractive index of the first principal surface 11a of the piece 11 of thin phosphor glass plate becomes uniform, so that the effect of the antireflection film can be increased. Preferably, a glass layer is also provided on the second principal surface 11b of the piece 11 of thin phosphor glass plate for the purpose of increasing the antireflection effect as just described.

The glass making the glass layer is preferably made of the same material as the glass making the glass matrix 3 in the piece 11 of thin phosphor glass plate. By doing so, the difference in refractive index between the glass matrix 3 in the piece 11 of thin phosphor glass plate and the glass layer becomes extremely small, so that the light reflection loss at both the interfaces can be reduced. The thickness of the glass layer is preferably 0.003 mm to 0.1 mm, more preferably 0.005 mm to 0.03 mm, and particularly preferably 0.01 mm to 0.02 mm. If the glass layer is too thin, the exposed phosphor may not sufficiently be coated. On the other hand, if the glass layer is too thick, excitation light and fluorescence may be absorbed by the glass layer to decrease the luminous efficiency.

Generally, as the thickness of a thin phosphor glass plate to be obtained is smaller, the thin phosphor glass plate is more likely to be broken during manufacture. Particularly, in obtaining a thin phosphor glass plate having a thickness of below 0.3 mm, the thin phosphor glass plate is more likely to be broken during the manufacturing process. Unlike the above, the thin phosphor glass plate 1 and the piece 11 of thin phosphor glass plate according to the present invention can be more certainly manufactured by the manufacturing method described below. However, the following manufacturing method is merely an example of the manufacturing method for a thin phosphor glass plate according to the present invention.

(Manufacturing Method)

FIG. 4 is a schematic plan view for illustrating a manufacturing method for a thin phosphor glass plate according to an embodiment of the present invention. FIGS. 5(*a*) and 5(*b*) are schematic cross-sectional views for illustrating the manufacturing method for a thin phosphor glass plate according to the embodiment of the present invention. FIG. 6 is a view of a polishing member for use in the manufacturing method for a thin phosphor glass plate according to the embodiment of the present invention when viewed from the side where a phosphor glass base material is polished. FIG. 7 is a schematic perspective view for illustrating the manufacturing method for a thin phosphor glass plate according to the embodiment of the present invention. FIGS. 8(*a*) and 8(*b*) are schematic cross-sectional views for illustrating the manufacturing method for a thin phosphor glass plate according to the embodiment of the present invention. FIGS. 5(*a*), 5(*b*), 8(*a*), and 8(*b*) show cross sections of a portion taken along the line I-I in FIG. 7.

As shown in FIG. 4, a plurality of phosphor glass base materials 21 are prepared. The phosphor glass base material 21 is a base material containing a phosphor 2 shown in FIG. 2 and a glass matrix 3 in which the phosphor 2 is dispersed. The phosphor glass base material 21 has a first principal surface 21a and a second principal surface 21b opposed to each other. The number of phosphor glass base materials 21 to be prepared is at least one.

Next, the phosphor glass base materials 21 are placed on a stage 22 and their second principal surfaces 21b are fixed onto the stage 22. As shown in FIG. 5(*a*), the stage 22 includes a plurality of first holes 22a and a plurality of second holes 22b. In this embodiment, the phosphor glass base materials 21 are fixed onto the stage 22 by sucking them through the plurality of first holes 22a. However, the method for fixing the phosphor glass base materials 21 is not limited to the above method. The first holes 22a and the second holes 22b may be connected to each other.

Next, as shown in FIG. 5(*b*), the first principal surfaces 21a of the phosphor glass base materials 21 are polished with a polishing member 23. As shown in FIG. 6, the polishing member 23 includes an abrasive layer 24. The abrasive layer 24 has an annular shape. The abrasive layer 24 may be composed of a plurality of circularly arranged abrasive layer pieces. In this case, each adjacent two of the abrasive layer pieces are preferably spaced, for example, not less than 5° and not more than 15°, apart from each other when viewed in plan. By doing so, abrasive sludge produced in the step of polishing the phosphor glass base materials 21 can be efficiently discharged through the spaces between the abrasive layer pieces to the outside. In this embodiment, the abrasive layer 24 is made of a sintered glass body containing diamond particles. The polishing member 23 has an approximately cylindrical shape and includes an opening 23a. However, the shape and material of the abrasive layer 24 and the shape of the polishing member 23 are not limited to the above.

As shown in FIG. 7, in the step of polishing the phosphor glass base materials 21, the polishing member 23 and the stage 22 are disposed so that the center of the polishing member 23 is not aligned with the center of the stage 22 when viewed in plan. In this embodiment, the polishing member 23 is disposed so that the outer peripheral edge of the abrasive layer 24 comes to the center of the stage 22 when viewed in plan. Next, as shown in the arrows B in FIG. 7, the polishing member 23 is rotated counterclockwise around an axis of rotation extending in the thickness direction of the phosphor glass base materials 21. Furthermore, as shown in the arrows C, the stage 22 is rotated clockwise around an axis of rotation extending in the above thickness direction. In other words, the polishing member 23 and the stage 22 are rotated in mutually opposite directions around the axes of rotation extending in the above thickness direction. Thus, the phosphor glass base materials 21 can be efficiently polished. Alternatively, the phosphor glass base materials 21 may be rotated clockwise and the stage 22 may be rotated counterclockwise.

The positional relationship between the polishing member 23 and the stage 22 is not particularly limited, but, as in this embodiment, the outer peripheral edge of the abrasive layer 24 preferably comes to the center of the stage 22. Thus, when the polishing member 23 and the stage 22 are rotated in mutually opposite directions as described above, all the phosphor glass base materials 21 on the stage 22 can be certainly and efficiently polished.

The method for polishing the phosphor glass base materials 21 is not limited to the above method. For example, the phosphor glass base materials 21 may be polished by rotating only one of the polishing member 23 and the stage 22. Alternatively, the phosphor glass base materials 21 may be polished by translating at least one of the polishing member 23 and the stage 22.

Heretofore, in manufacturing a thin phosphor glass plate, a phosphor glass base material has been fixed onto a stage by fitting the phosphor glass base material into the aperture of an apertured plate-shaped jig (carrier). Therefore, in order to polish a principal surface of the phosphor glass base material, it is necessary to make the thickness of the jig smaller than the thickness of the phosphor glass base material. In order to obtain a thinner phosphor glass plate, it is necessary to make the jig thinner, which makes the strength of the jig decrease accordingly. As a result, the jig may be broken during polishing of the phosphor glass base material and, in turn, the phosphor glass base material may be broken. Particularly, in manufacturing a thin phosphor glass plate with a thickness of below 0.3 mm, the phosphor glass base material is more likely to be broken.

In this embodiment, the second principal surfaces 21b of the phosphor glass base materials 21 are fixed directly onto the stage 22. Therefore, the phosphor glass base materials 21 can be polished without use of such a jig as described above. Thus, the phosphor glass base materials 21 are less likely to be broken, so that thin phosphor glass plates 1 can be more certainly manufactured.

In the step of polishing the phosphor glass base materials 21, a liquid, such as water, is preferably jetted onto the phosphor glass base materials 21. For example, the liquid may be jetted onto the phosphor glass base materials 21 from the opening 23a of the polishing member 23 or may be jetted onto the phosphor glass base materials 21 from the outside of the polishing member 23 and the stage 22. By doing so, in polishing the phosphor glass base materials 21, the phosphor glass base materials 21 can be effectively cooled. Thus, it can be restrained that during polishing the phosphor glass base materials 21 is unduly increased in temperature to become softened and deformed and, as a result, softened and deformed glass burns and sticks to the abrasive layer 24 or the polishing rate is changed by the temperature increase.

Furthermore, by jetting a liquid, such as water, onto the phosphor glass base materials 21, abrasive sludge can be efficiently discharged to the outside, so that it can be restrained that excess abrasive sludge forms undue scratches on the surfaces of the phosphor glass base materials 21.

The surface of the abrasive layer 24 where the phosphor glass base materials 24 are to be polished may be provided with at least one groove extending from the opening 23a to the outer peripheral edge. In this case, in polishing the phosphor glass base materials 21 while jetting a liquid thereonto from the opening 23a, abrasive sludge can be suitably discharged through the groove. Thus, the phosphor glass base materials 21 can be more efficiently polished.

Next, as shown in FIG. 8(a), the suction through the first holes 22a is canceled to strip off the phosphor glass base materials 21 from the stage 22. In doing so, as shown in the arrows D, a liquid, such as water, is further jetted through the second holes 22b of the stage 22 to the second principal surfaces 21b of the phosphor glass base materials 21 to strip off the phosphor glass base materials 21 from the stage 22. Thus, the phosphor glass base materials 21 can be more certainly stripped off from the stage 22. Although in this embodiment the suction is performed through the first holes 22a and the jetting of the liquid is performed through the second holes 22b, the stage 22 may include holes through which both the suction and the liquid jetting are performed. For example, the stage 22 may be formed of a porous body so that the suction and liquid jetting can be performed through the pores formed in the porous body. Alternatively, the liquid jetting during the stripping may not necessarily be performed. Still alternatively, instead of the liquid, a gas may be jetted through the second holes 22b to strip off the phosphor glass base materials 21 from the stage 22.

Next, as shown in FIG. 8(b), the phosphor glass base materials 21 are turned upside down and the polished first principal surfaces 21a are fixed onto the stage 22. Then, the second principal surfaces 21b of the phosphor glass base materials 21 are polished with the polishing member 23. In doing so, the fixing and polishing are performed in the same manners as in the steps shown in FIGS. 5(a), 5(b), and 7. Thus, the thin phosphor glass plate 1 shown in FIG. 1 can be obtained.

In the step of polishing the first principal surfaces 21a and the step of polishing the second principal surfaces 21b, the polishing is preferably performed so that the arithmetic mean roughness (Ra) of the polished surface reaches below 0.1 µm and particularly 0.05 µm or less. Thus, light scattering is less likely to occur during incidence of excitation light and during exit of a synthesized light of excitation light and fluorescence, so that the luminous efficiency can be increased.

In the step of polishing the first principal surfaces 21a and the step of polishing the second principal surfaces 21b, the polishing is performed so that the thickness reaches preferably 0.03 mm to 0.3 mm (exclusive of 0.3 mm), more preferably 0.05 mm to 0.15 mm, and particularly preferably 0.08 mm to 0.12 mm. Thus, the luminous flux can be effectively increased, thin phosphor glass plates can be obtained without breakage, and the pieces of thin phosphor glass plate can be easily mounted on LEDs or the like.

Next, in the same manner as in the step shown in FIG. 8(a), the thin phosphor glass plates 1 are stripped off from the stage 22. The second principal surfaces 21b of the phosphor glass base materials 21 may not necessarily be polished and thin phosphor glass plates 1 may be obtained by polishing only the first principal surfaces 21a. In this case, in the step of polishing the first principal surfaces 21a, the polishing is preferably performed so that the thickness falls within the above range.

Hereinafter, a description will be given of an example of a manufacturing method for the piece 11 of thin phosphor glass plate shown in FIG. 3.

FIGS. 9(a) and 9(b) are schematic cross-sectional views for illustrating a manufacturing method for pieces of thin phosphor glass plate according to an embodiment of the present invention.

By the above manufacturing method or other methods, a thin phosphor glass plate 1 is prepared. Next, as shown in FIG. 9(a), the second principal surface 1b of the thin phosphor glass plate 1 is bonded onto a support sheet 25. In this embodiment, the support sheet 25 is formed so that a UV-curing resin, such as an acrylic resin or an epoxy resin, is applied to a sheet made of a polyethylene resin, a polyolefin resin, a vinyl chloride resin or the like, and the support sheet 25 is attached at the UV-curing resin side to the second principal surface 1b of the thin phosphor glass plate 1. The materials for the support sheet 25 are not limited to the above materials.

Next, breaking grooves 1c are formed in the first principal surface 1a of the thin phosphor glass plate 1. In this embodiment, the breaking grooves 1c are formed to form a grid. The breaking grooves 1c can be formed, but not particularly limited to, for example, by scribing the first principal surface 1a of the thin phosphor glass plate 1. The breaking grooves 1c may be formed before the thin phosphor glass plate 1 is bonded to the support sheet 25. The surface of the thin phosphor glass plate 1 to be bonded to the support sheet 25 may be the first principal surface 1a. The breaking grooves 1c may be formed in the second principal surface 1b.

Next, as shown in FIG. 9(b), a film 26 is attached to the first principal surface 1a where the breaking grooves 1c are formed. In this embodiment, the film 26 is made of a polyethylene resin, a polyolefin resin, a vinyl chloride resin or the like. However, the material for the film 26 is not limited to the above materials.

Meanwhile, a plurality of support blades 27 are prepared for the purpose of placing the thin phosphor glass plate 1 thereon. Next, the thin phosphor glass plate 1 is turned upside down and placed on the plurality of support blades 27 with the film 26 in contact with the plurality of support blades 27. In this embodiment, the thin phosphor glass plate 1 is supported through the film 26 by the support blades 27. Therefore, the thin phosphor glass plate 1 is less likely to be scratched. The film 26 may not necessarily be used in the manufacturing method for pieces of thin phosphor glass plate.

Next, a pressing member 28 is disposed in a position facing the breaking groove 1c. The pressing member 28 includes a blade 29. The blade 29 is pressed, from the support sheet 25 side, against a region where the breaking groove 1c is formed. Thus, while remaining bonded to the support sheet 25, the thin phosphor glass plate 1 is broken into pieces in the thickness direction along the breaking groove 1c and thus divided into a plurality of parts. Also in the other regions where the other breaking grooves 1c are formed, the breaking is performed in the same manner. Next, the film 26 is peeled off from a collection of thin phosphor glass plate pieces 11 divided from the thin phosphor glass plate 1. Next, the collection of thin phosphor glass plate pieces 11 is irradiated with UV from the support sheet 25 side to cure the UV-curing resin of the support sheet 25. Next, the pieces 11 of thin phosphor glass plate are taken off the support sheet 25. By dividing the thin phosphor glass plate 1 into pieces in the above manner, a plurality of pieces 11 of thin phosphor glass plate can be obtained.

In this embodiment, the thickness of the thin phosphor glass plate 1 before being divided into pieces has already been reduced by polishing. Thus, the thin phosphor glass plate 1 can be broken into pieces by a lower stress and, therefore, the thin phosphor glass plate 1 is less likely to be damaged during the breaking, so that the pieces 11 of thin phosphor glass plate can be more certainly manufactured. In addition, even when the thin phosphor glass plate 1 has a small thickness and pitches at which the breaking grooves 1c are formed are small, the thin phosphor glass plate 1 can be easily broken into pieces. Therefore, small pieces 11 of thin phosphor glass plate can be more easily and more certainly manufactured. Hence, a smaller light-emitting device can be easily manufactured.

The division of the thin phosphor glass plate 1 into pieces may be performed by dicing. However, the division of the thin phosphor glass plate 1 into pieces is preferably performed by the above breaking. Thus, during the division, a thin phosphor glass plate 1 having a small thickness is even less likely to be damaged.

REFERENCE SIGNS LIST

1 . . . thin phosphor glass plate
1a . . . first principal surface
1b . . . second principal surface
1c . . . breaking groove
2 . . . phosphor
3 . . . glass matrix
11 . . . piece of thin phosphor glass plate
11a . . . first principal surface
11b . . . second principal surface
11c . . . outer peripheral edge
21 . . . phosphor glass base material
21a . . . first principal surface
21b . . . second principal surface
22 . . . stage
22a . . . first hole
22b . . . second hole
23 . . . polishing member
23a . . . opening
24 . . . abrasive layer
25 . . . support sheet
26 . . . film
27 . . . support blade
28 . . . pressing member
29 . . . blade
30 . . . light-emitting device
34 . . . light source
35 . . . reflective member
100 . . . light-emitting device
101 . . . piece of phosphor glass plate

The invention claimed is:

1. A manufacturing method for pieces of a thin phosphor glass plate, the method comprising the steps of:
preparing a phosphor glass base material having a first principal surface and a second principal surface opposed to each other;
placing the phosphor glass base material on a stage and fixing the second principal surface onto the stage;
obtaining a thin phosphor glass plate by polishing the first principal surface of the phosphor glass base material with a polishing member including an abrasive layer;
forming breaking grooves in a principal surface of the thin phosphor glass plate; and
breaking the thin phosphor glass plate into pieces along the breaking grooves.

2. The manufacturing method for pieces of a thin phosphor glass plate according to claim 1, further comprising the steps of:
fixing the first principal surface of the phosphor glass base material onto the stage; and
polishing the second principal surface of the phosphor glass base material with the polishing member.

3. The manufacturing method for pieces of a thin phosphor glass plate according to claim 1, wherein in the step of polishing the phosphor glass base material, the polishing member is rotated around an axis of rotation extending in a thickness direction of the phosphor glass base material.

4. The manufacturing method for pieces of a thin phosphor glass plate according to claim 1, wherein in the step of polishing the phosphor glass base material, the stage is rotated around an axis of rotation extending in a thickness direction of the phosphor glass base material.

5. The manufacturing method for pieces of a thin phosphor glass plate according to claim 3, wherein in the step of polishing the phosphor glass base material, the polishing member and the stage are rotated in mutually opposite directions around an axis of rotation extending in the thickness direction of the phosphor glass base material.

6. The manufacturing method for pieces of a thin phosphor glass plate according to claim 1, wherein in the step of polishing the phosphor glass base material, the phosphor glass base material is polished to have a thickness of 0.15 mm or less.

7. The manufacturing method for pieces of a thin phosphor glass plate according to claim 1, wherein in the step of polishing the phosphor glass base material, the phosphor glass base material is polished so that a polished one of the first principal surface and the second principal surface has an arithmetic mean roughness (Ra) of below 0.1 µm.

8. The manufacturing method for pieces of a thin phosphor glass plate according to claim 1, wherein the phosphor glass base material is fixed onto the stage by suction.

9. The manufacturing method for pieces of a thin phosphor glass plate according to claim 1, wherein after the step of polishing the phosphor glass base material, the phosphor glass base material is stripped off from the stage by jetting a liquid from the stage to the phosphor glass base material.

10. The manufacturing method for pieces of a thin phosphor glass plate according to claim 1, wherein in the step of breaking the thin phosphor glass plate, the thin phosphor glass plate is broken by pressing a position facing the breaking grooves of the thin phosphor glass plate with a pressing member.

11. The manufacturing method for pieces of a thin phosphor glass plate according to claim 10, wherein the thin phosphor glass plate is broken in a state where a film is attached to the principal surface of the thin phosphor glass plate on which the breaking grooves are formed.

12. The manufacturing method for pieces of a thin phosphor glass plate according to claim 11, wherein the film is made of a polyethylene resin, a polyolefin resin, or a vinyl chloride resin.

\* \* \* \* \*